United States Patent
McCulley et al.

(10) Patent No.: US 11,406,010 B2
(45) Date of Patent: Aug. 2, 2022

(54) THERMAL MANAGEMENT SYSTEM AND METHOD THEREFOR

(71) Applicant: BENCHMARK ELECTRONICS, INC., Tempe, AZ (US)

(72) Inventors: Michael D. McCulley, Tempe, AZ (US); Michelle C. Howard, Tempe, AZ (US)

(73) Assignee: Benchmark Electronics, Inc., Tempe, AZ (US)

(*) Notice: Subject to any disclaimer, the term of this patent is extended or adjusted under 35 U.S.C. 154(b) by 0 days.

(21) Appl. No.: 16/896,978

(22) Filed: Jun. 9, 2020

(65) Prior Publication Data
US 2021/0112656 A1 Apr. 15, 2021

Related U.S. Application Data

(60) Provisional application No. 62/850,892, filed on May 21, 2019.

(51) Int. Cl.
| | | |
|---|---|---|
| *H05K 7/20* | (2006.01) | |
| *G06F 1/20* | (2006.01) | |
| *H05K 1/02* | (2006.01) | |
| *H05K 1/14* | (2006.01) | |

(52) U.S. Cl.
CPC ......... *H05K 1/0272* (2013.01); *H05K 1/0203* (2013.01); *H05K 1/144* (2013.01); *H05K 7/2039* (2013.01); *H05K 7/20172* (2013.01); *H05K 7/20272* (2013.01); *H05K 2201/041* (2013.01); *H05K 2201/064* (2013.01)

(58) Field of Classification Search
CPC .... H05K 1/0272; H05K 1/0203; H05K 1/144; H05K 7/2039; H05K 7/20272; H05K 7/20172; H05K 2201/064; H05K 2201/041; H01L 23/427; H01L 23/467; H01L 23/473
See application file for complete search history.

(56) References Cited

U.S. PATENT DOCUMENTS

| | | | | |
|---|---|---|---|---|
| 4,327,399 A | * | 4/1982 | Sasaki | F28D 15/0233 174/15.2 |
| 5,142,441 A | * | 8/1992 | Seibold | H05K 1/0272 361/689 |
| 5,199,165 A | * | 4/1993 | Crawford | H01L 23/427 165/104.33 |
| 6,023,413 A | * | 2/2000 | Umezawa | H01L 23/467 361/697 |

(Continued)

FOREIGN PATENT DOCUMENTS

JP 2004071643 A * 3/2004

OTHER PUBLICATIONS

Matsuda Kazutoshi; Oyamada Shigemasa, "Heat Sink for Electronic Components", Mar. 4, 2004, Sony Corp., Entire Document (Translation of JP 2004071643). (Year: 2004).*

*Primary Examiner* — Stephen S Sul
(74) *Attorney, Agent, or Firm* — Weiss & Moy, P.C.; Jeffrey D. Moy

(57) ABSTRACT

A thermal management system has a first circuit board. The first circuit board has a first circuit board dielectric layer. At least one fluid channel is formed through the first circuit board and along a width or length of the first circuit board, wherein the at least one fluid channel is encapsulated.

17 Claims, 3 Drawing Sheets

(56) References Cited

U.S. PATENT DOCUMENTS

| | | | | |
|---|---|---|---|---|
| 6,377,457 | B1* | 4/2002 | Seshan | H01L 23/467 |
| | | | | 165/104.33 |
| 6,665,185 | B1* | 12/2003 | Kulik | H05K 1/0272 |
| | | | | 165/80.4 |
| 7,738,249 | B2* | 6/2010 | Chan | H05K 1/0272 |
| | | | | 361/679.53 |
| 2006/0227508 | A1* | 10/2006 | Hornung | H01L 23/467 |
| | | | | 361/703 |
| 2007/0063337 | A1* | 3/2007 | Schubert | H01L 23/473 |
| | | | | 257/714 |
| 2008/0123295 | A1* | 5/2008 | Wu | H01L 23/427 |
| | | | | 361/697 |
| 2008/0130234 | A1* | 6/2008 | Maehara | H05K 7/205 |
| | | | | 361/704 |
| 2009/0279257 | A1* | 11/2009 | Lower | H05K 1/0272 |
| | | | | 361/699 |
| 2010/0315787 | A1* | 12/2010 | Li | H05K 1/0206 |
| | | | | 361/709 |
| 2011/0146947 | A1* | 6/2011 | Liu | H01L 23/4093 |
| | | | | 165/67 |
| 2011/0297361 | A1* | 12/2011 | Carbone | H01L 23/3672 |
| | | | | 165/185 |
| 2012/0162928 | A1* | 6/2012 | Das | H01L 23/488 |
| | | | | 361/728 |
| 2017/0167799 | A1* | 6/2017 | Silvano de Sousa | |
| | | | | H05K 1/0206 |
| 2018/0376626 | A1* | 12/2018 | Hurbi | H05K 7/20963 |
| 2020/0294981 | A1* | 9/2020 | Feichtinger | H05K 1/0207 |
| 2020/0344924 | A1* | 10/2020 | Harrigan | H05K 1/144 |

* cited by examiner

THERMAL MANAGEMENT SYSTEM AND METHOD THEREFOR

RELATED APPLICATIONS

This patent application is related to U.S. Provisional Application No. 62/850,892 filed May 21, 2019, entitled "THERMAL MANAGEMENT SYSTEM AND METHOD THEREFOR" in the name of Michael D. McCulley and Michelle C. Howard, and which is incorporated herein by reference in its entirety. The present patent application claims the benefit under 35 U.S.C § 119(e).

TECHNICAL FIELD

The present application relates generally to a thermal management system, and more specifically, to an in-substrate thermal management system which uses fluid channels formed within the substrate of a circuit board to transfer heat away from an Integrated Circuit (IC) attached to the circuit board.

BACKGROUND

As electronic devices get smaller in size and provide more and more features, integrated circuits (IC) also need to become smaller and more complex. This generally requires increasing the number of electronic components of the IC and placing these electronic components into a smaller space thereby increasing the (IC) chip density. Further, the miniaturization of electronic devices also requires more ICs to be mounted onto system planar printed circuit boards (PCBs). These increases in the number of electrical components packed into such a small space generally creates a problem with heat.

Unfortunately, cooling by natural convection, radiation and/or by heat conduction through the PCB is insufficient to keep temperatures of the ICs below maximum operating limits. Because of the above, a variety of approaches have been developed for dissipating heat generated by the ICs. One type of heat-dissipating device is a simple fan mounted to the circuit board. The fan may be used to circulate air, removing the hot air and introducing cooler air so as to dissipate the heat generated by the electronic components.

Another method of removing heat is the use of a heat sink. A heat sink is a thermal conductive metallic device designed to absorb and disperse heat away from the IC. Heat sinks may be outfitted with built-in fans to help keep both the IC and the heat sink at an appropriate temperature. The heat sink may have fins, thin slices of metal connected to the base of the heat sink, which help to distribute the heat over a larger area.

Unfortunately, cooling using the above techniques, may not always be successful. For instance, variations in IC stack-up height and parallelism to the PCB present notable problems. For example, circuit packs utilized in high-speed optoelectronic and wireless communications applications have high-power components that must have EMI shielding. However, air circulated by cooling fans in such products cannot penetrate the EMI shield, thereby leading to disastrous results.

With regards to heat sinks, a problem that may be encountered in making a proper thermal connection between the ICs and the heat sink is that the distance between the heat sink and the ICs can vary, both because of IC stack-up height variations and because of thermal expansion of the entire assembly. As such, it is often difficult to achieve a proper, reliable contact between surfaces to maintain a good thermal path. Additionally, the two surfaces to be thermally connected may not be sufficiently parallel and in fact may shift relative to one another as the assembly is transported, or thermally or mechanically stressed.

A further issue with both the fans and the heat sinks is that neither of these devices are able to regulate the temperature. Fans and heat sinks are designed to draw the heat away from the IC thereby cooling the IC. Fans and heat sinks are unable to regulate and keep the temperature of the IC at a predefined optimal operating temperature.

Therefore, it would be desirable to provide a system and method that overcomes the above.

SUMMARY

In accordance with one embodiment, a thermal management system is disclosed. The thermal management system has a first circuit board. The first circuit board has a first circuit board dielectric layer. At least one fluid channel is formed through the first circuit board and along a width or length of the first circuit board, wherein the at least one fluid channel is encapsulated.

In accordance with one embodiment, a thermal management system is disclosed. The thermal management system has a first circuit board, wherein the first circuit board has a first circuit board dielectric layer. At least one fluid channel is formed through the first circuit board dielectric layer along a width or length of the first circuit board dielectric layer, wherein the at least one fluid channel is encapsulated. A conductive layer is formed in the at least one fluid channel. A second circuit board is coupled to the first circuit board and enclosing the at least one fluid channel.

In accordance with one embodiment, a thermal management system is disclosed. The thermal management system has a first circuit board, wherein the first circuit board has a first circuit board dielectric layer. Metal traces are formed on a first surface and a second surface opposing the first surface of the first circuit board dielectric layer. At least one fluid channel is formed through the first circuit board along a width or length of the first circuit board, the at least one fluid channel formed through the metal trace formed on the second surface of the first circuit board dielectric layer, into the first circuit board dielectric layer exposing the metal trace formed on the first surface of the first circuit board dielectric layer, wherein the at least one fluid channel is encapsulated. A conductive layer is formed in the at least one fluid channel. A second circuit board is coupled to the second surface of the first circuit board and enclosing the at least one fluid channel. The second circuit board comprises: a second circuit board dielectric layer and metal traces formed on a first surface and a second surface opposing the first surface of the second circuit board dielectric layer. A plurality of connection channels is formed in the second circuit board improving thermal transfer in the thermal management system and electrically connecting the second circuit board to the first circuit board.

BRIEF DESCRIPTION OF THE DRAWINGS

The present application is further detailed with respect to the following drawings. These figures are not intended to limit the scope of the present application but rather illustrate certain attributes thereof. The same reference numbers will be used throughout the drawings to refer to the same or like parts.

DESCRIPTION OF THE APPLICATION

Figure 1:
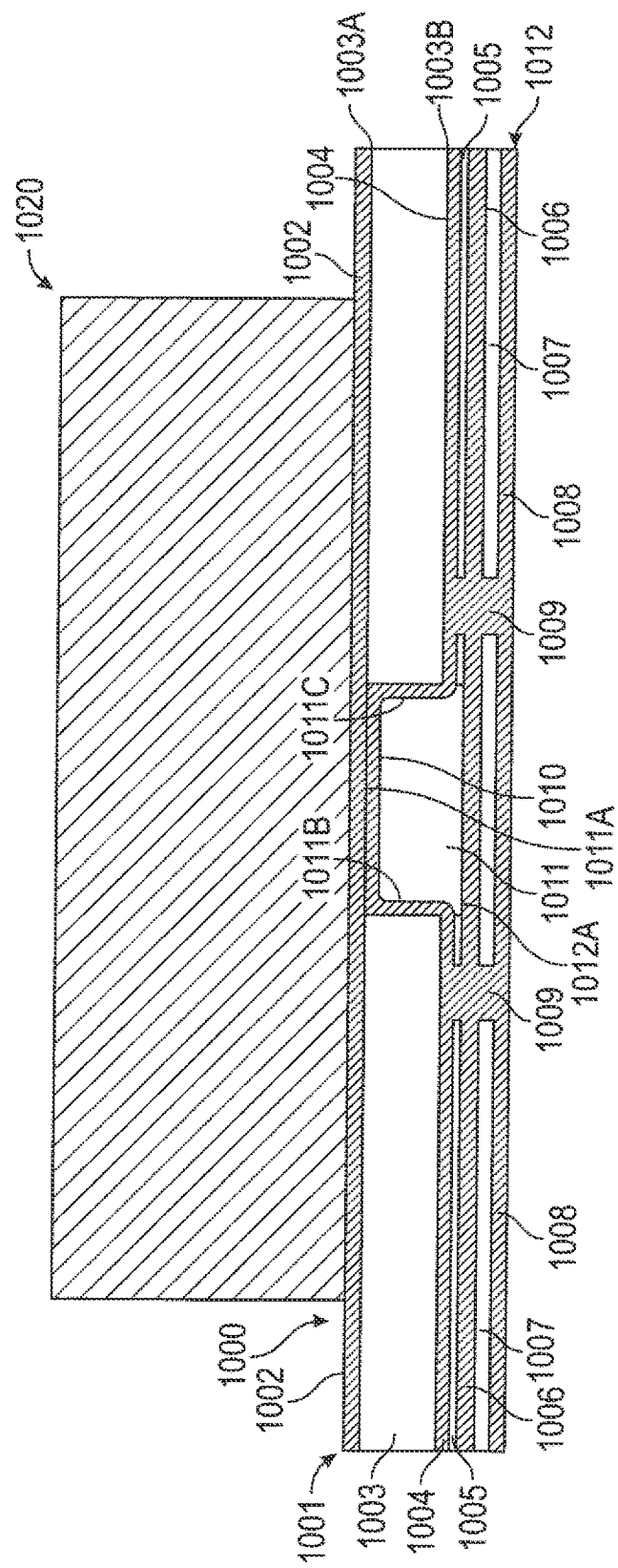
FIG. 1 is a cross-sectional view of an exemplary cross-sectional of a circuit board assembly in accordance with one aspect of the present application.
Figure 2A:
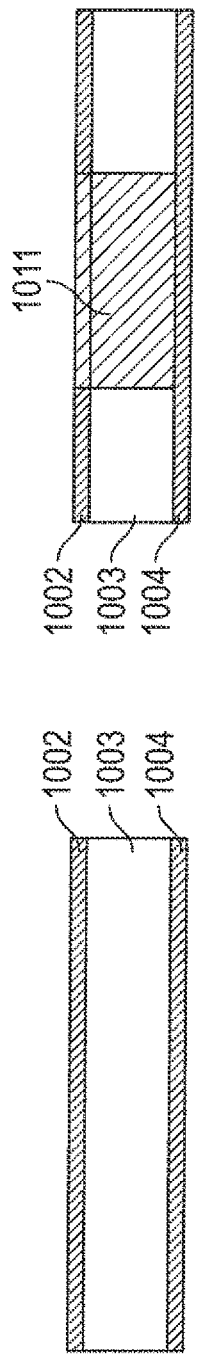
FIG. 2A-2F are cross-sectional views depicting an exemplary method of forming the circuit board assembly of FIG. 1 in accordance with one aspect of the present application.
Figure 2B:
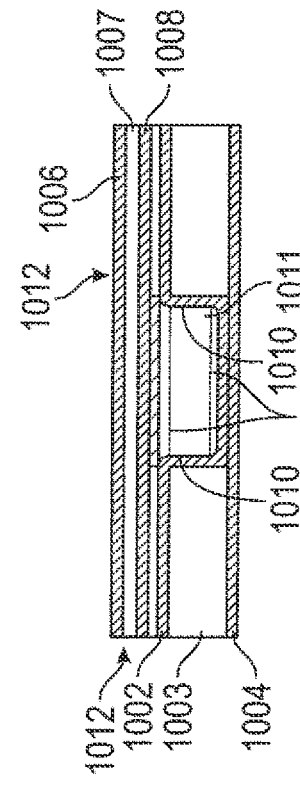
Figure 2C:
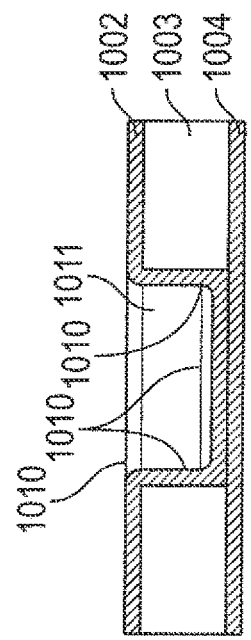
Figure 2D:
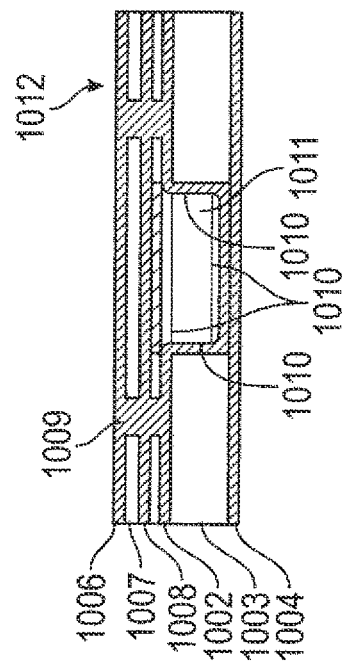
Figure 2E:
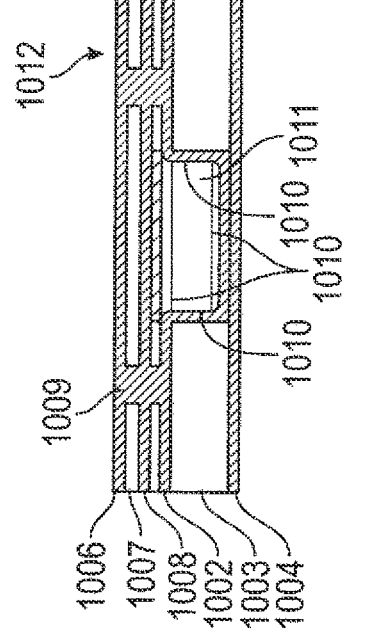
Figure 2F:
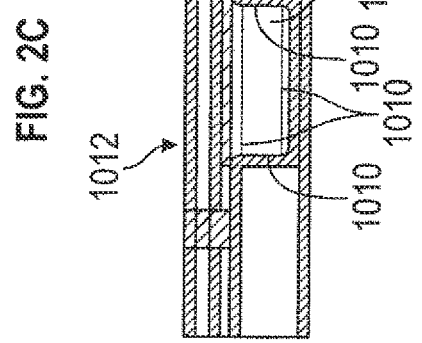

The description set forth below in connection with the appended drawings is intended as a description of presently preferred embodiments of the disclosure and is not intended to represent the only forms in which the present disclosure can be constructed and/or utilized. The description sets forth the functions and the sequence of steps for constructing and operating the disclosure in connection with the illustrated embodiments. It is to be understood, however, that the same or equivalent functions and sequences can be accomplished by different embodiments that are also intended to be encompassed within the spirit and scope of this disclosure.

Embodiments of the exemplary thermal management system provides self-contained fluid channels built within a substrate of a circuit board. The fluid channels may be used for in-substrate thermal management of components placed on the circuit board. Fluids may flow through the fluid channels and may be used for active cooling/heating thereby keeping the components to a preferred temperature.

Referring to FIG. 1 and FIG. 2A-2G, a circuit board 1000 in accordance with one embodiment may be disclosed. The circuit board 1000 may be a rigid or flexible circuit board depending on the use of the circuit board 1000. The circuit board 1000 may be formed of a first circuit board 1001. The first circuit board 1001 may have a dielectric layer 1003. The dielectric layer 1003 may be an electrical insulator that may not allow an electrical current to flow through dielectric layer 1003 when a voltage is applied. The dielectric layer 1003 may be formed of porcelain, mica, glass, plastics and similar materials. Other materials that may be used as the dielectric layer 1003 may be FR4 which is glass-reinforced epoxy laminate material, LCP which is a liquid crystal polymer, Polytetrafluoroethylene (PTFE) which is a synthetic fluoropolymer of tetrafluoroethylene, Polyether ether ketone (PEEK) which is a colorless organic thermoplastic polymer in the polyaryletherketone (PAEK) family as well as other non-conductive materials. The above is given as examples and should not be seen in a limiting manner.

Conductive traces 1002 and 1004 may be formed on an upper surface 1003A and lower surface 1003B respectively. The conductive traces 1002 and 1004 may form predetermined circuit patterns on each surface 1003A and 1003B respectively of the dielectric layer 1003. The conductive traces 1002 and 1004 may be formed of copper, copper alloys, gold, silver, nickel, aluminum or other conductive materials. The above listing is given as an example and should not be seen in a limiting manner.

A fluid channel 1011 may be formed in the dielectric layer 1003. The fluid channel 1011 may be formed to run through and across the first circuit board 1001. The fluid channel 1011 may run along a length and/or width of the first circuit board. The fluid channel 1011 may be formed between, or below any circuit layers that require thermal transportation, spreading, or dissipation. The fluid channel 1011 may be formed by chemical etching, laser ablation, embossing or by other comparable methods. While FIG. 1 and FIGS. 2A-2F show one fluid channel 1011, any number of fluid channels may be formed in the dielectric layer 1003. In the embodiment shown, the fluid channel 1011 may be formed through the conductive trace 1004 and into the surface 1003B of the dielectric layer 1003. In accordance with one embodiment, the fluid channel 1011 may be formed through the dielectric layer 1003 so to expose the conductive traces 1002.

A conductive layer 1010 may be applied to enclose the fluid channel 1011. As may be seen in FIGS. 1 and 2C-2F, the conductive layer 1010 may be applied to a wall 1011A so that the conductive layer 1010 may be in contact with the conductive trace 1002. The conductive layer 1010 may be applied to walls 1011B and 1011C so that the conductive layer 1010 may be in contact with the conductive trace 1004. The conductive layer 1010 may also be applied to a first surface 1012A of a second circuit board 1012. The conductive layer 1010 may be formed through plating, an electrodeposition process or by similar methods. In accordance with one embodiment, copper may be deposited to form the conductive layer 1010. However, other materials such as, but not limited to copper alloys, gold, silver, nickel, aluminum or other conductive materials may be used.

The fluid channel 1011 may be encapsulated to allow a liquid to flow there through. The fluid may be used to cool and/or heat electrical components placed on the circuit board 1000 to allow the electrical component to maintain an optimal thermal state for electrical component's operational status.

A second circuit board 1012 may be attached to the first circuit board 1001. As may be seen in FIG. 1 and FIGS. 2D-2F, the second circuit board 1012 may be attached to the surface 1003B of the dielectric layer 1003, on top of the conductive trace 1004 and over the fluid channel 1011, thereby enclosing the fluid channel 1011. The second circuit board 1012 may be attached so that the conductive layer 1010 applied to the first surface 1012A of a second circuit board 1012 may be positioned over and cover the fluid channel 101.

The circuit board 1012 may be attached using an adhesive 1005 such as an epoxy, liquid crystal polymer, or similar adhesives. In accordance with one embodiment, the circuit board 1012 may be attached using a fusion bond. The fusion bond 1005 may be formed by heating and bonding the circuit board 1012 to the surface 1003B of the dielectric layer 1003, on top of the conductive trace 1004 and over the fluid channel 1011. By securing the circuit board 1012 over the fluid channel 1011, the fluid channel 1011 may be enclosed forming a liquid tight seal thereby allowing a fluid to flow through the fluid channel 1011 without leaking.

In the present embodiment, the fluid channel 1011 may be shown to have conductive layer 1010 on all interior sides of the fluid channel 1011. However, this is just shown as an example and should not be seen in a limiting manner. The fluid channel 1011 may have any number of interior sides coated with the conductive layer 1010. In accordance with one embodiment, other types of coatings may also be applied in the interior sides the fluid channel 1011 to encapsulated the fluid channel 1011 to allow a liquid to flow there through.

The second circuit board 1012 may have a dielectric layer 1007. The dielectric layer 1007 may be an electrical insulator that may not allow an electrical current to flow through dielectric layer 1007 when a voltage is applied. The dielectric layer 1007 may be formed of porcelain, mica, glass, plastics and similar materials. Other materials that may be used as the dielectric layer 1007 may be FR4 which is glass-reinforced epoxy laminate material, LCP which is a liquid crystal polymer, Polytetrafluoroethylene (PTFE) which is a synthetic fluoropolymer of tetrafluoroethylene; Polyether ether ketone (PEEK) which is a colorless organic thermoplastic polymer in the polyaryletherketone (PAEK) family as well as other non-conductive materials. The above is given as examples and should not be seen in a limiting manner.

Conductive traces 1006 and 1008 may be formed on an upper surface 1007A and lower surface 1007B respectively of the dielectric layer 1007. The conductive traces 1006 and 1008 may form predetermined circuit patterns on each surface 1007A and 1007B respectively of the dielectric layer 1007. The conductive traces 1006 and 1008 may be formed of copper, copper alloys, aluminum or other conductive materials. The above listing is given as an example and should not be seen in a limiting manner.

A plurality of connection channels 1009 may be formed in the second circuit board 1012. The connection channels 1009 may be used to improve thermal transfer in the circuit board 1000. The connection channels 1009 may be used to couple conductive traces together. The connection channels 1009 may be used to coupled conductive traces of the first circuit board 1001 to the second circuit board 1012 and to couple different conductive traces of the second circuit board 1012 together. In the present embodiment, as may be seen in FIG. 1 and FIG. 2F, the connection channels 1009 may be used to couple the conductive traces 1004 of the first circuit board 1001 to the conductive traces 1006 of the second circuit board 1012 and to couple the conductive traces 1006 of the second circuit board 1012 to the conductive traces 1007 of the second circuit board 1012. However, the above is given as examples. Other connection channels 1009 may be formed to couple different conductive traces of the circuit board 1000 together.

The connection channels 1009 may be formed by chemically etching, laser ablating or by other similar methods, channels 1009A. The channels 1009A may then be plated and/or filled with a conductive material 1009B forming the connection channels 1009. The conductive material layer 1010 may be formed through an electro-deposition process or by similar methods. In accordance with one embodiment, copper may be deposited to form the conductive layer 1010. However, other materials such as, but not limited to copper alloys, gold, silver, nickel, aluminum or other conductive materials may be used.

An electrical device 1020 may be attached to the circuit board 1000. The electrical device 1020 may be positioned above one or more of the fluid channels 1011. In the embodiment shown, the electrical device 1020 may be attached to the conductive traces 1002 of the first circuit board 1001 and above the fluid channel 1011. The fluid channels 1011 may be used to try and maintain an optimal operating temperature of the electrical device 1020. By maintaining the electrical device 1020 in an optimal operating range, one may extend the operating life of the electrical device 1020.

Fluids may flow through the fluid channels 1011 and may be used for active cooling/heating, thereby keeping the electrical device 1020 at a preferred operating temperature. The fluid may be water, glycol, gallium, or any other type of fluid. The conductive layer 1010 which may be used to enclose the fluid channel 1011 act as a thermal conductor. The conductive layer 1010 may be used to transfer heat from a hotter electrical device 1020 to a cooler fluid, or to transfer heat from a warmer fluid to a cooler electrical device 1020 thereby keeping the electrical device 1020 at a preferred operating temperature. The plurality of connection channels 1009 may be also be used to improve the thermal transfer in the circuit board 1000. The plurality of connection channels 1009 may be used to transfer heat to/from the fluid channel 1011.

The circuit board 1000 may be part to a single- or two-phase cooling system to remove and dissipate heat. In a pumped single-phase loop, the fluid is pumped through the fluid channels 1011 which is attached to the heat source/electronic device 1020 being cooled. The temperature of the fluid increases as it passes through fluid channels 1011, absorbing and storing the heat in its sensible heat capacity. In a two-phase cooling system heat is transferred by the evaporation and condensation of a portion or all of the fluid. Typically, a fluid near saturation is pumped through the fluid channels 1011 which is attached to the heat source/electronic device 1020 being cooled, where it starts to boil, cooling the heat source/electronic device 1020 and storing the energy in the latent heat of the fluid. The two phase (liquid and vapor) fluid then flows to a condenser, where the heat is removed, condensing the vapor, so that a single phase (fluid) exits the condenser, and the cycle repeats.

Figure 3A:
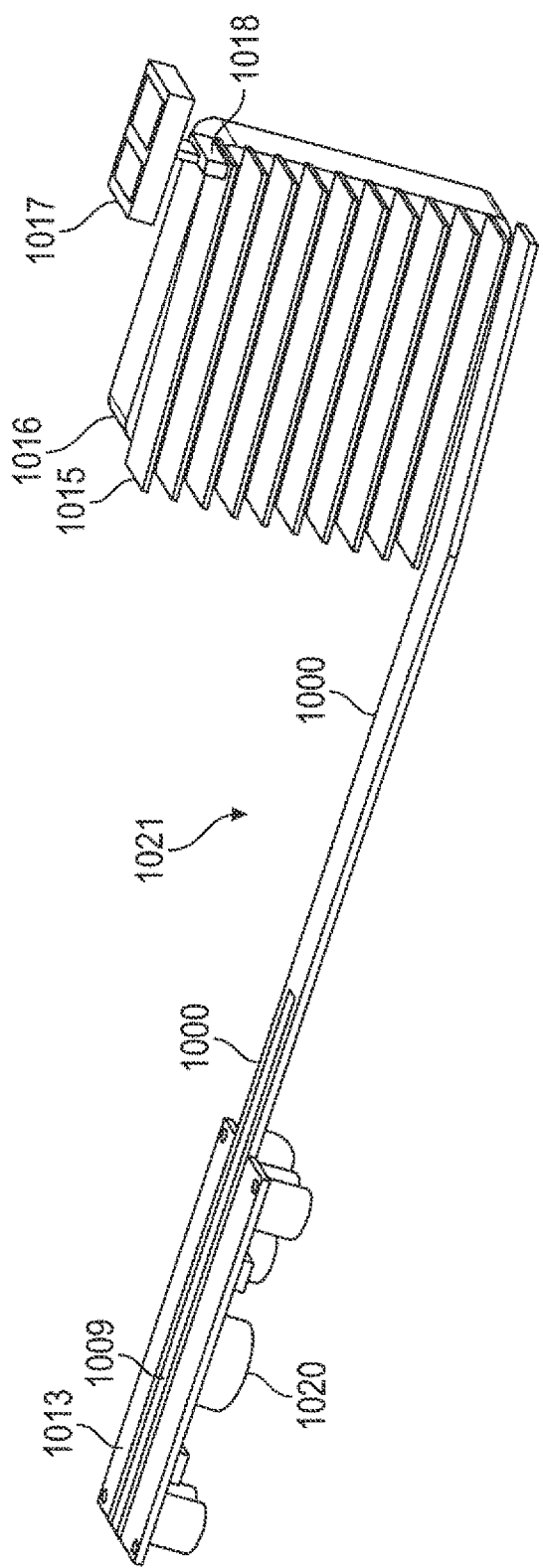
FIG. 3A is a perspective view of an exemplary thermal management system using the circuit board assembly of FIG. 1 in accordance with one aspect of the present application.
Figure 3B:
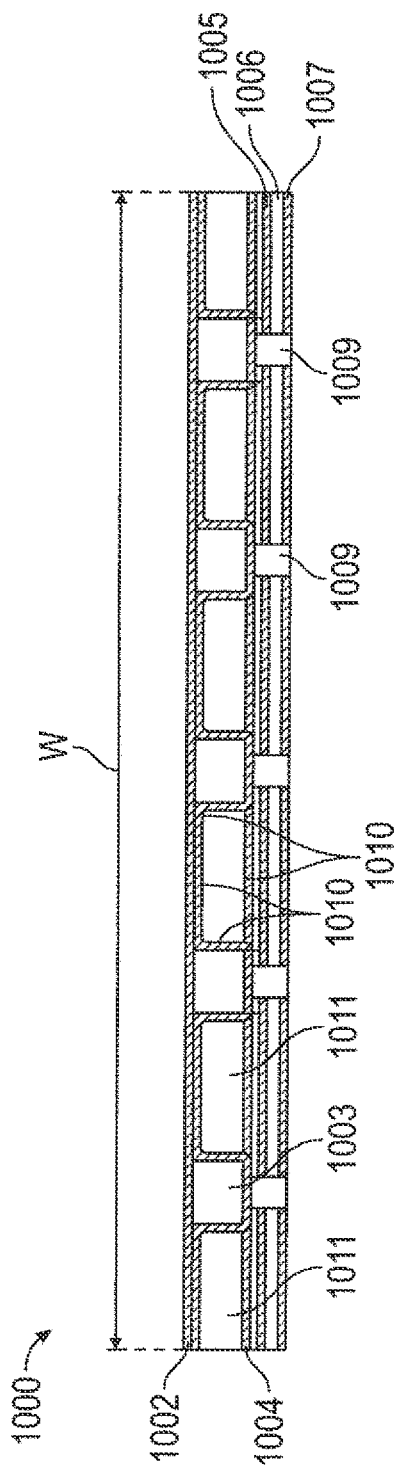
FIG. 3B is a cross-sectional view of an exemplary circuit board assembly used in the thermal management system of FIG. 3B in accordance with one aspect of the present application.

Referring to FIGS. 3A-3B, a thermal management system 1021 may be seen. In this embodiment, the thermal management system 1021 may use the circuit board 1000 to control the temperature of an existing circuit board 1013 having an electronic device 1020 mounted thereon. The circuit board 1000 may be attached to, between, or below any circuit layers that require thermal transportation, spreading, or dissipation on the circuit board 1013. In accordance with one embodiment, the circuit board 1000 may be attached to a bottom surface of the circuit board 1013 below the electronic device 1020 similar to where a hear sink may be positioned.

The circuit board 1000 may be attached to the circuit board 1013 in different manners. In accordance with one embodiment, an adhesive may be used to attached the circuit board 1000 to the bottom surface of the circuit board 1013. To further enhance the connection between attached the circuit board 1000 to the bottom surface of the circuit board 1013, the connection channels 1009 (may be used to couple the circuit board 1000 to the bottom surface of the circuit board 1013. The connection channels 1009 may be used to couple the circuit board 1000 to conductive traces formed on the circuit board 1013.

The circuit board 1000 may be a single member circuit board 1000. Alternatively, the circuit board 1000 may be formed of a plurality of sections coupled together. In accordance with one embodiment, the circuit board 1000 may be a flexible circuit board. If the circuit board 1000 is a flexible circuit board, the dielectric layer 1003 of the circuit board 1000 may be formed from Polyimide, Liquid Crystal Polymer, or other flexible substrate materials.

The circuit board 1000 may have a plurality of fluid channel 1011 spaced across a width W of the circuit board 1000 wherein each fluid channel 1011 may run a length of the circuit board 1000. The fluid channels 1011 may be used to try and maintain an operating temperature of the electrical device 1020 by having a fluids flow through one or more of the fluid channels 1011 for active cooling/heating of the electrical device 1020.

It should be noted that if the circuit board 1000 is made of multiple parts, the number of fluid channels 1011 in a first section of the circuit board 1000 may be equal to the number of fluid channels 1011 formed in a second section. When the first section of the circuit board 1000 is attached to the second section of the circuit board 1000, the fluid channels 1011 of the first section of the circuit board 1000 should align with the fluid channels 1011 formed in the second section of the circuit board 1000.

The circuit board 1000 may be coupled to a heat sink 1015. The heat sink 1015 may be used to draw heat away from the circuit board 1000, The heat sink 1015 may be formed of a flexible substrate like Polyimide, Liquid Crystal Polymer, or other flexible or non-flexible substrates. In accordance with one embodiment, the heat sink 1015 may be formed of a flexible substrate like pyrolytic graphite. Pyrolytic graphite is a highly conductive and lighter than aluminum, copper and other similar materials. It also has a higher thermal conductivity than the aforementioned.

As may be seen in FIG. 3A, the heat sink 1015 formed of a flexible substrate may allow the heat sink 1015 to be bent into different configurations thereby expanding the surface area of the heat sink 1015. While a zig-zag/accordion pattern may be seen in FIG. 3A, this is just shown as an example. Other patterns may be formed such as spirals which may be wrapped around a device or other like patterns may be used without departing from the scope of the present invention. Any type of pattern may be formed as long as a bend radius of the material used to form the heat sink 1015 is not too tight as to damage the heat sink 1015. By having the ability to shape the heat sink 1015, one may be able to direct/transfer the heat to any desired area.

A cooling fan 1016 may be coupled to the heat sink 1015. The cooling fan 1016 may be used to blow air on the heat sink 1015. The air flow from the cooling fan 1016 may be used to dissipate heat from the heat sink 1015.

The thermal management system 1021 may have a fluid pump 1017. The fluid pump 1017 may be used to move fluids through the fluid channels 1011. A connector 1018 may be used to attach fluid pump 1017 to the fluid channels 1011. While the embodiment in FIG. 3A shows the fluid pump 1017 on the heat sink 1015, this is just shown as an example. The fluid pump 1017 may be attached directly to the circuit board 1000 or other components of the thermal management system 1012.

The thermal management system 1021 provides a circuit board 1000 having in-substrate, solid metallic, fluid channels 1011 that may be used as fluid pathways for an in-substrate thermal management using active cooling/heating. Fluids may flow within the fluid channels 1011 to transfer heat away from sensitive and very hot component areas. The thermal management system 1021 may use heat sinks 1015. The heat sinks 1015 may be formed of a light weight flexible substrate that may allow the heat sink 1015 to be bent into different configurations thereby expanding the surface area of the heat sink 1015. By having the ability to shape the heat sink 1015, one may be able to direct/transfer the heat to any desired area.

The thermal management system 1021 is described above as being used for active cooling/heating of electronic components 1020. However, the circuit board 1000 and thermal management system 1021 may be used in any type of electronic system. More specifically, the circuit board 1000 and thermal management system 1021 may be used in any electronic system that may utilize large or heavy heat sinks and requires Size, Weight and Power (SWaP) reduction such as, but not limited to, phased array radar, space applications, avionics boards, automotive electronics, UAV electronics, server farms and the like. The circuit board 1000 and thermal management system 1021 may even be used for temperature control of non-electronic devices. The circuit board 1000 and thermal management system 1021 may be formed within military and emergency response tactical uniforms to control the temperature of the individual wearing the uniform.

The foregoing description is illustrative of particular embodiments of the application, but is not meant to be a limitation upon the practice thereof. The following claims, including all equivalents thereof, are intended to define the scope of the application.

What is claimed is:

1. A thermal management system comprising:
    a first circuit board, wherein the first circuit board has a first circuit board dielectric layer;
    at least one fluid channel formed through the first circuit board and along a width or length of the first circuit board; and
    a conductive layer applied to all interior side walls of the at least one fluid channel to encapsulate the at least one fluid channel;
    a heat sink coupled to the first circuit board, the heat sink formed of a flexible substrate, the flexible substrate bent into a zig zag shape;
    a cooling fan coupled to the heat sink; and
    a fluid pump coupled to the at least one fluid channel and to the heat sink.

2. The thermal management system of claim 1, comprising a metal trace formed on a first surface of the first circuit board dielectric layer and a metal trace formed on a second surface opposing the first surface of the first circuit board dielectric layer.

3. The thermal management system of claim 2, wherein the at least one fluid channel is formed through the metal trace formed on the second surface of the first circuit board dielectric layer, into the first circuit board dielectric layer exposing the metal trace formed on the first surface of the first circuit board dielectric layer.

4. The thermal management system of claim 3, comprising a second circuit board coupled to the second surface of the first circuit board dielectric layer and enclosing the at least one fluid channel, the conductive layer applied to a surface of the second circuit board coupled to the second surface of the first circuit board dielectric layer and enclosing the at least one fluid channel.

5. The thermal management system of claim 4, wherein the second circuit board comprises:
    a second circuit board dielectric layer; and
    a metal trace formed on a first surface of the second circuit board dielectric layer and a metal trace formed on a second surface opposing the first surface of the second circuit board dielectric layer.

6. The thermal management system of claim 5, comprising a plurality of connection channels formed in the second circuit board for improving thermal transfer in the thermal management system.

7. The thermal management system of claim 6, wherein each of the plurality of connection channels comprises:
    a tunnel formed in the second circuit board; and
    plating formed on the tunnel.

8. The thermal management system of claim 5, comprising a plurality of connection channels formed in the second circuit board for improving thermal transfer in the thermal management system and to electrically couple the second circuit board to the first circuit board.

9. The thermal management system of claim 4, wherein the heat sink is coupled to the first circuit board and the second circuit board.

10. A thermal management system comprising:
a first circuit board, wherein the first circuit board has a first circuit board dielectric layer;
at least one fluid channel formed through the first circuit board dielectric layer along a width or length of the first circuit board dielectric layer, wherein the at least one fluid channel is encapsulated;
a conductive layer applied to all interior side walls of the at least one fluid channel to encapsulate the at least one fluid channel;
a second circuit board coupled to the first circuit board and enclosing the at least one fluid channel; and
a heat sink coupled to the first circuit board and the second circuit board, the heat sink formed of a flexible substrate, the flexible substrate bent into a zig zag shape;
a cooling fan coupled to the heat sink; and
a fluid pump coupled to the at least one fluid channel and to the heat sink.

11. The thermal management system of claim 10, comprising a metal trace formed on a first surface of the first circuit board dielectric layer and a metal trace formed on a second surface opposing the first surface of the first circuit board dielectric layer, wherein the at least one fluid channel is formed through the metal trace formed on the second surface of the first circuit board dielectric layer, into the first circuit board dielectric layer exposing the metal trace formed on the first surface of the first circuit board dielectric layer.

12. The thermal management system of claim 10, wherein the second circuit board comprises:
a second circuit board dielectric layer; and
a metal trace formed on a first surface od the second circuit board dielectric layer; and
a metal trace formed on a second surface opposing the first surface of the second circuit board dielectric layer.

13. The thermal management system of claim 10, comprising a plurality of connection channels formed in the second circuit board dielectric layer for improving thermal transfer in the thermal management system.

14. The thermal management system of claim 10, comprising a plurality of connection channels formed in the second circuit board dielectric layer for improving thermal transfer and to electrically couple the second circuit board to the first circuit board.

15. The thermal management system of claim 14, wherein each of the plurality of connection channels comprises:
a tunnel formed in the second circuit board dielectric layer; and
plating formed on the tunnel.

16. A thermal management system comprising:
a first circuit board, wherein the first circuit board has a first circuit board dielectric layer;
a metal trace formed on a first surface of the first circuit board dielectric layer and a metal trace formed on a second surface opposing the first surface of the first circuit board dielectric layer;
at least one fluid channel formed through the first circuit board along a width or length of the first circuit board, the at least one fluid channel formed through the metal trace formed on the second surface of the first circuit board dielectric layer, into the first circuit board dielectric layer exposing the metal trace formed on the first surface of the first circuit board dielectric layer, wherein the at least one fluid channel is encapsulated;
a conductive layer applied to all interior side walls of the at least one fluid channel to encapsulate the at least one fluid channel;
a second circuit board coupled to the second surface of the first circuit board dielectric layer and enclosing the at least one fluid channel, wherein the second circuit board comprises:
a second circuit board dielectric layer; and
a metal trace formed on a first surface of the second circuit board dielectric layer and a metal trace formed on a second surface opposing the first surface of the second circuit board dielectric layer;
a plurality of connection channels formed in the second circuit board for improving thermal transfer in the thermal management system and electrically connecting the second circuit board to the first circuit board;
a heat sink coupled to the first circuit board and the second circuit board, the heat sink formed of a flexible substrate, the flexible substrate bent into a zig zag pattern;
a cooling fan coupled to the heat sink; and
a fluid pump coupled to the at least one fluid channel and to the heat sink.

17. The thermal management system of claim 16, wherein the flexible substrate is formed of pyrolytic graphite, the pyrolytic graphite bent into the zig zag pattern as long as a bend radius of the pyrolytic graphite is not exceeded.

* * * * *